US006751141B1

United States Patent
Alvandpour et al.

(12) United States Patent
(10) Patent No.: US 6,751,141 B1
(45) Date of Patent: Jun. 15, 2004

(54) DIFFERENTIAL CHARGE TRANSFER SENSE AMPLIFIER

(75) Inventors: Atila Alvandpour, Beaverton, OR (US); Manoj Sinha, Boise, ID (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/305,703

(22) Filed: Nov. 26, 2002

(51) Int. Cl.[7] .................................. G11C 7/02
(52) U.S. Cl. ................ 365/208; 365/154; 365/203; 365/205; 365/189.05; 365/185.25
(58) Field of Search ................ 365/208, 154, 365/203, 205, 189.05, 185.25

(56) References Cited

U.S. PATENT DOCUMENTS

| | | | | |
|---|---|---|---|---|
| 5,297,090 A | * | 3/1994 | McClure | 365/203 |
| 5,771,190 A | * | 6/1998 | Okamura | 365/154 |
| 6,075,729 A | * | 6/2000 | Ohhata et al. | 365/190 |
| 6,442,060 B1 | * | 8/2002 | Leung et al. | 365/154 |

* cited by examiner

Primary Examiner—Richard Elms
Assistant Examiner—Pho M. Luu
(74) Attorney, Agent, or Firm—Seth Z. Kalson

(57) ABSTRACT

A sense amplifier for reading memory cells in a SRAM, the sense amplifier comprising two gate-biased pMOSFETs, each corresponding to a selected bitline. The gates of the two gate-biased pMOSFETs have their gates biased to a bias voltage, their sources coupled to the selected bitlines via column-select transistors, and their drains coupled via pass transistors to the two ports of two cross-coupled inverters, the cross-coupled inverters forming a latch. After a selected bitline pair has been pre-charged and the pre-charge phase ends, one of the two gate-biased pMOSFETs quickly goes into its subthreshold region as one of the bitlines discharges through its corresponding memory cell, thereby cutting off the bitline's capacitance from the sense amplifier. When the pass transistors are enabled, the other of the two pMOSFETs allows a significant bitline charge to transfer via its corresponding pass transistor to its corresponding port, whereas a relatively much smaller charge is transferred to the other port. This charge transfer scheme allows a differential voltage to quickly develop at the ports, thereby providing a fast latch and read operation with reduced power consumption. Bitline voltage swing may also be reduced to reduce power consumption.

16 Claims, 3 Drawing Sheets

DIFFERENTIAL CHARGE TRANSFER SENSE AMPLIFIER

FIELD

The present invention relates to memory circuits, and more specifically, to sense amplifiers for SRAM (Static Random Access Memory).

BACKGROUND

Consider a computer system, such as that illustrated in FIG. 1. In FIG. 1, microprocessor die 102 comprises many sub-blocks, such as arithmetic logic unit (ALU) 104 and on-die cache 106. Microprocessor 102 may also communicate to other levels of cache, such as off-die cache 108. Higher memory hierarchy levels, such as system memory 110, are accessed via host bus 112 and chipset 114. In addition, other off-die functional units, such as graphics accelerator 116 and network interface controller (NIC) 118, to name just a few, may communicate with microprocessor 102 via appropriate busses or ports.

Advanced microprocessors use large SRAM (Static Random Access Memory)caches with fast read/write operations to store data and instructions. Other components in the computer system of FIG. 1 may also use SRAM to store data. The bit of information stored within a memory cell of a SRAM is read by sensing the voltage developed on two complementary bitlines. An example of a sense amplifier for sensing the bitline voltages is provided in FIG. 2. Complementary bitlines 202 and 204 are connected to the sense amplifier by column-select transistors 206 and 208. These column-select transistors are turned ON by driving column-select line 210 LOW. Before a read operation is performed, pre-charge line 212 is driven LOW so that pMOSFETs 214, 216, and 218 charge bitlines 202 and 204 to $V_{DD}$ (HIGH). Transistors 220, 222, 224, and 226 are cross-coupled inverters, which are enabled by driving enable line 228 HIGH.

After pre-charge, when the column-select transistors are ON and the cross-coupled inverters are enabled, the selected memory cell will discharge one of the two complementary bitlines such that the pMOSFET in one of the two cross-coupled inverters switches ON, whereupon the cross-coupled inverters latch the data read from the selected memory cell.

The above may be explained in more detail as follows. Suppose the data stored in the memory cell is such that during a read operation, bitline 202 stays HIGH and bitline 204 goes LOW. Initially, both bitlines are pre-charged HIGH, pMOSFET 230 is ON, nMOSFETs 222 and 226 are ON and their sources and drains are HIGH, and pMOSFETs 220 and 224 are OFF. After pre-charge, pre-charge line 212 is driven HIGH, an enable line 228 is driven HIGH so that pMOSFET 230 switches OFF and nMOSFET 232 switches ON. Current will flow though bitline 202 from a HIGH ($V_{DD}$) potential to a LOW ($V_{SS}$) potential through nMOSFETs 222 and 232 for some time interval. The charge stored by the total capacitance connected to node 234 is discharged via bitline 204 to the memory cell and also the path comprising nMOSFET 226 and 232. Eventually node 234 is discharged to the point where pMOSFET 220 starts to switch ON and nMOSFET 222 starts to switch OFF. Bitline 204 will continue to discharge LOW.

As discussed above, there is some portion of time for which current flows from the $V_{DD}$ potential to the $V_{SS}$ potential through bitline 202. This results in wasted power. Also, a sufficient amount of charge must be dumped to ground so that node 234 is brought to the point where pMOSFET 220 starts to switch ON and nMOSFET 222 starts to switch OFF. In practice, to multiplex multiple bitlines to the sense amplifier, there will be multiple column-select pMOSFETs of the type pMOSFET 204 connected to node 234 which contributes to the total capacitance seen by node 234. As this total capacitance increases, the evaluation time also increases, thereby slowing down the read operation.

In high performance microprocessors, it is desirable for caches to waste as little energy as possible during a read operation, and for the read operation to be fast.

DESCRIPTION OF EMBODIMENTS

Figure 3:
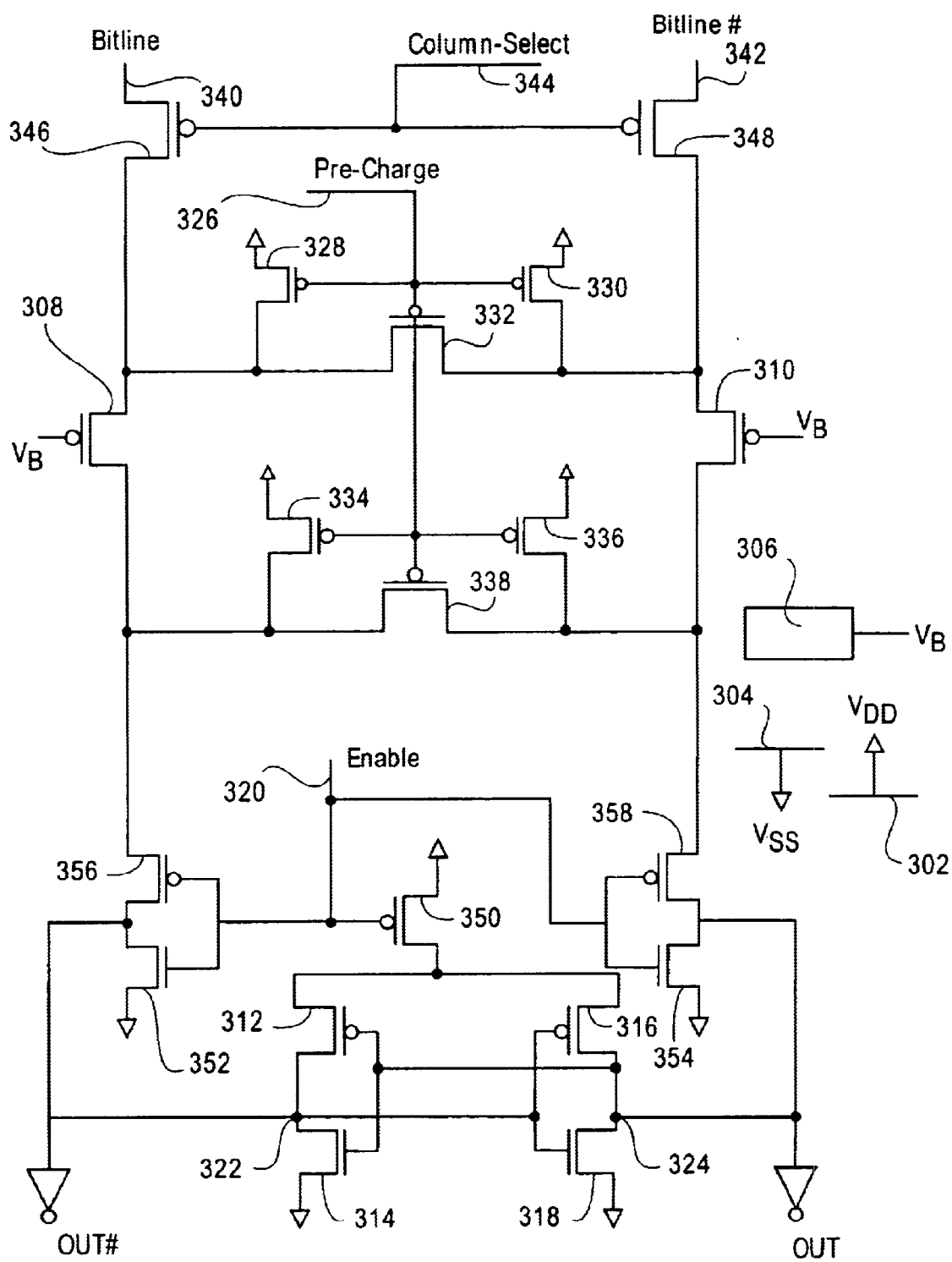
FIG. 3 is an embodiment of the present invention.

Before discussing the operation of the sense amplifier in FIG. 3, the three different voltages appearing in the circuit are discussed. A first supply rail 302 is at a voltage $V_{DD}$, and a second supply rail 304 is at a voltage $V_{SS}$, where $V_{SS}<V_{DD}$. It is to be understood that the term "supply rail" is in general some kind of conductive material, such as a copper interconnect, power plane, doped polysilicon, or the integrated circuit substrate itself upon which the circuit of FIG. 3 is formed. The voltage $V_{SS}$ of supply rail 304 may not necessarily refer to the substrate voltage, and it may or may not necessarily be a ground voltage by which other voltages are referenced to. A bias circuit 306 provides a bias voltage $V_B$ to the gates of pMOSFETs 308 and 310, where $V_{SS}<V_B \leq (V_{DD}-|V_T|)$, and where $V_T$ is the threshold voltage of pMOSFETs 308 and 310. (In the embodiment of FIG. 3, pMOSFETs 308 and 310 have substantially the same threshold voltage. More precisely, denoting the threshold voltages of pMOSFETs 308 and 310 as $V_{T1}$ and $V_{T2}$, $V_T$ in the previous inequality is to be interpreted as $V_T=\max\{|V_{T1}|, |V_{T2}|\}$.)

Column-select line 344 for the selected memory cell is driven LOW so that column-select pMOSFETs 346 and 348 switch ON to connect the selected memory cell to the sense amplifier. (In practice, there will be multiple bitline pairs coupled to the sense amplifier by multiple pairs of column-select transistors. For simplicity, only one pair of bitlines and one pair of column-select transistors are shown in FIG. 3.) During the pre-charge phase, pre-charge line 326 is LOW. With pre-charge line 326 LOW, pMOSFETs 328, 330, and 332 are ON to pre-charge HIGH bitlines 340 and 342, the sources and drains of column-select transistors 346 and 348, the sources of pMOSFETs 308 and 310, and the interconnects therebetween. Also, pMOSFETs 334, 336, and 338 are ON to pre-charge HIGH the drains of pMOSFETs 308 and 310, the sources of pMOSFETs 356 and 358, and the interconnects therebetween.

A first inverter comprises pMOSFET 312 and nMOSFET 314, and pMOSFET 316 and nMOSFET 318 form a second inverter, where the first and second inverters are cross-coupled to form a latch. During the pre-charge phase, enable line 320 is HIGH to switch ON nMOSFETs 352 and 354 so that nodes 322 and 324 are LOW. (Nodes 322 and 324 may be viewed as either the input ports or the output ports of the cross-coupled first and second inverters.)

After pre-charge, and before a read operation begins, pre-charge line 326 is driven HIGH so that pMOSFETs 328, 330, 332, 334, 336, and 338 are OFF. After pre-charge line 326 is driven HIGH, enable line 320 is driven LOW so that nMOSFETs 352 and 354 switch OFF, pMOSFETs 356 and 358 switch ON to couple the selected memory cell to the nodes (ports) 322 and 324 of the latch, and pMOSFET 350 switches ON to enable the latch.

To describe in more detail the operation of the embodiment in FIG. 3, and how the time interval between driving pre-charge line 326 HIGH and driving enable line 320 LOW is determined, assume for the rest of the description that the stored information in the selected memory cell is such that the selected memory cell couples bitline 340 to $V_{DD}$ supply rail 302 and couples bitline 342 to $V_{SS}$ supply rail 304.

At the end of the pre-charge phase, nodes 322 and 324 are LOW but the bitlines have been charged HIGH. Both gate-biased pMOSFETs 308 and 310 are in their triode regions because their initial drain-to-source voltages are close to zero. A first capacitor defined by bitline 340, the diffusion capacitances of pMOSFETs 346 and 308, the interconnects between pMOSFETs 346 and 308 and between pMOSFETs 308 and 356, the diffusion capacitance seen at the source of pMOSFET 356, and the diffusion capacitances of other column-select transistors that may be connected to gate-biased pMOSFET 308, will store a first charge during the pre-charge phase.

Likewise, a second capacitor defined by bitline 342, the diffusion capacitances of pMOSFETs 348 and 310, the interconnects between pMOSFETs 348 and 310 and between pMOSFETs 310 and 358, the diffusion capacitance seen at the source of pMOSFET 358, and the diffusion capacitances of other column-select transistors that may be connected to gate-biased pMOSFET 310, will store a second charge during the pre-charge phase. When the pre-charge phase ends, this second capacitor will start to discharge to $V_{SS}$ supply rail 304 via the selected memory cell, causing the voltage potential of the source of gate-biased pMOSFET 310 to fall. As this voltage potential approaches $V_B+|V_T|$, gate-biased pMOSFET 310 will go into its sub-threshold region. This effectively cuts off most of the second capacitor from the source of pMOSFET 358.

When the voltage potential at the source of gate-biased pMOSFET 358 approaches $V_B+|V_T|$, enable line 320 is driven LOW to switch ON pMOSFETs 356 and 358. Thus, the interval of time between driving pre-charge line 326 HIGH to end the pre-charge phase and driving enable line 320 LOW to begin the enable phase should, in a preferred embodiment, be at least that interval of time for which the voltage potential at the source of gate-biased pMOSFET 358 approaches $V_B+|V_T|$ once pre-charge line 326 has been driven HIGH.

When enable line 320 is driven LOW to switch ON pMOSFET 356, most of the first charge will transfer to node 322, thereby raising the voltage of node 322. A third capacitor defined by the diffusion capacitance seen at the source of pMOSFET 358, the diffusion capacitance seen at the drain of gate-biased pMOSFET 310, and the capacitance due to that portion of the interconnect between the source of pMOSFET 358 and the drain of gate-biased pMOSFET 310, will store a third charge during the pre-charge phase. When the pre-charge phase has ended and the enable line 320 is driven LOW to switch ON pMOSFET 358, the third capacitor will start to transfer some of the third charge to node 324. This will start to raise the voltage at node 324.

The capacitance of the third capacitor is much smaller than that of the first capacitor. As a result, when pMOSFETs 356 and 358 switch ON the voltage at node 322 will initially rise much faster than that of node 324. Even if the latch comprising the cross-coupled inverters were not present, the voltage at node 322 would quickly charge to $V_{DD}C_{T1}/C_L$, where $C_L$ is the capacitance loading the drain of pMOSFET 356, and $C_{T1}$ is given by $1/C_{T1}=(1/C_1+1/C_L)$ where $C_1$ is the capacitance of the first capacitor. Because $C_1$ is relatively large, the voltage $V_{DD}C_{T1}/C_L$ is close to $V_{DD}$. (The voltage at node 322 would eventually continue to rise all the way to $V_{DD}$ because of the selected memory cell pulling bitline 340 to $V_{DD}$.) But with the latch present, pMOSFET 312 will also charge node 322, which further speeds up the process of charging node 322 to $V_{DD}$.

If the cross-coupled inverters were not present, the voltage at node 324 would rise no higher than $V_{DD}C_{T3}/C_L$, where for simplicity the same symbol $C_L$ is used for the capacitance loading the drain of pMOSFET 358, which substantially equals the capacitance loading the drain of pMOSFET 356, and $C_{T3}$ is given by $1/C_{T3}=(1/C_3+1/C_L)$ where $C_3$ is the capacitance of the third capacitor. Because $C_3$ is relatively small, the voltage $V_{DD}C_{T3}/C_L$ is much smaller than the voltage $V_{DD}C_{T1}/C_L$. But with the cross-coupled inverters present, nMOSFET 318 will kick in, which will start to discharge node 324, so that node 324 is eventually pulled to $V_{SS}$ and may not even have a chance to rise all the way to $V_{DD}C_{T3}/C_L$.

Figure 1:
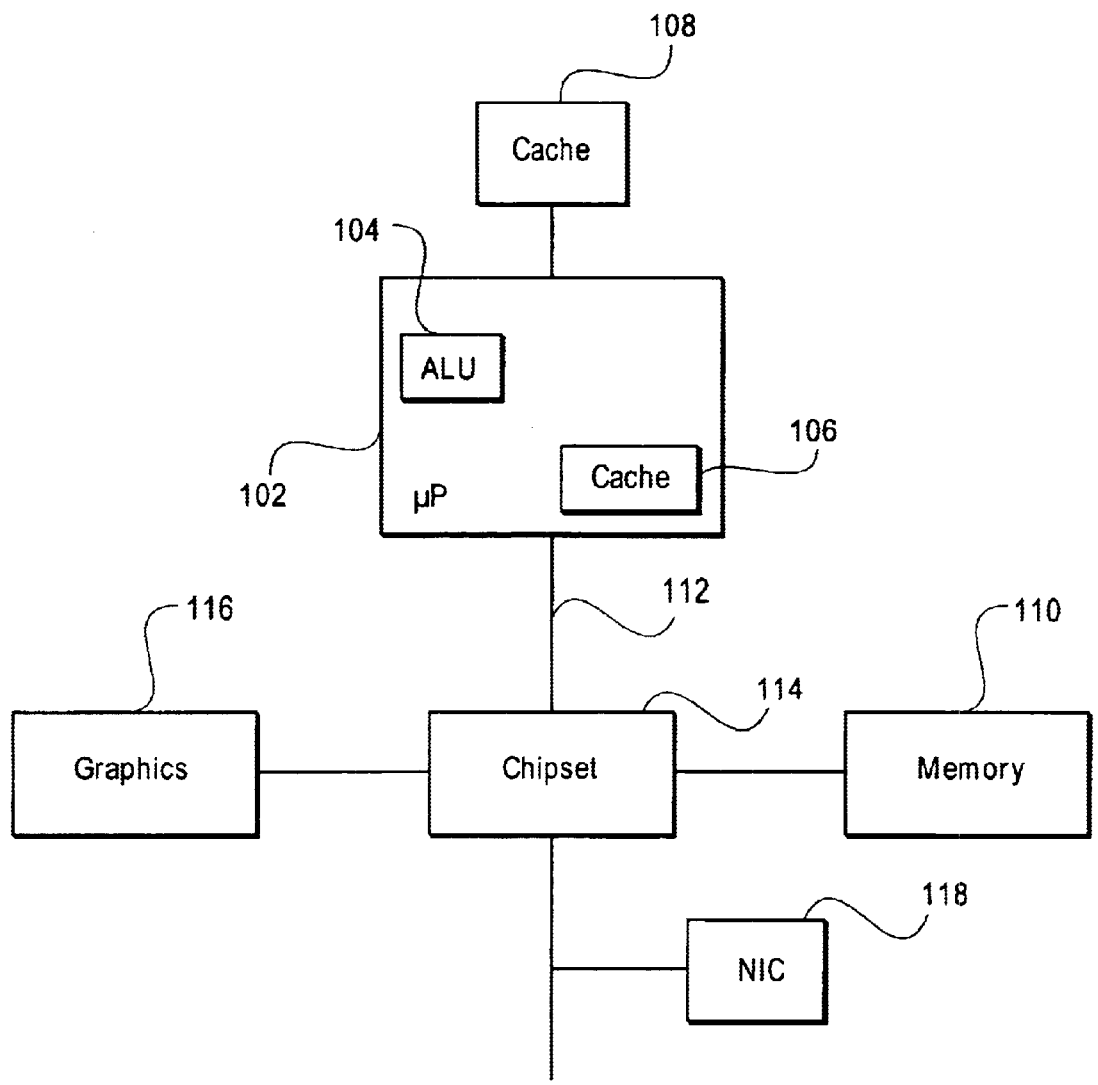
FIG. 1 is a prior art computer system.
Figure 2:
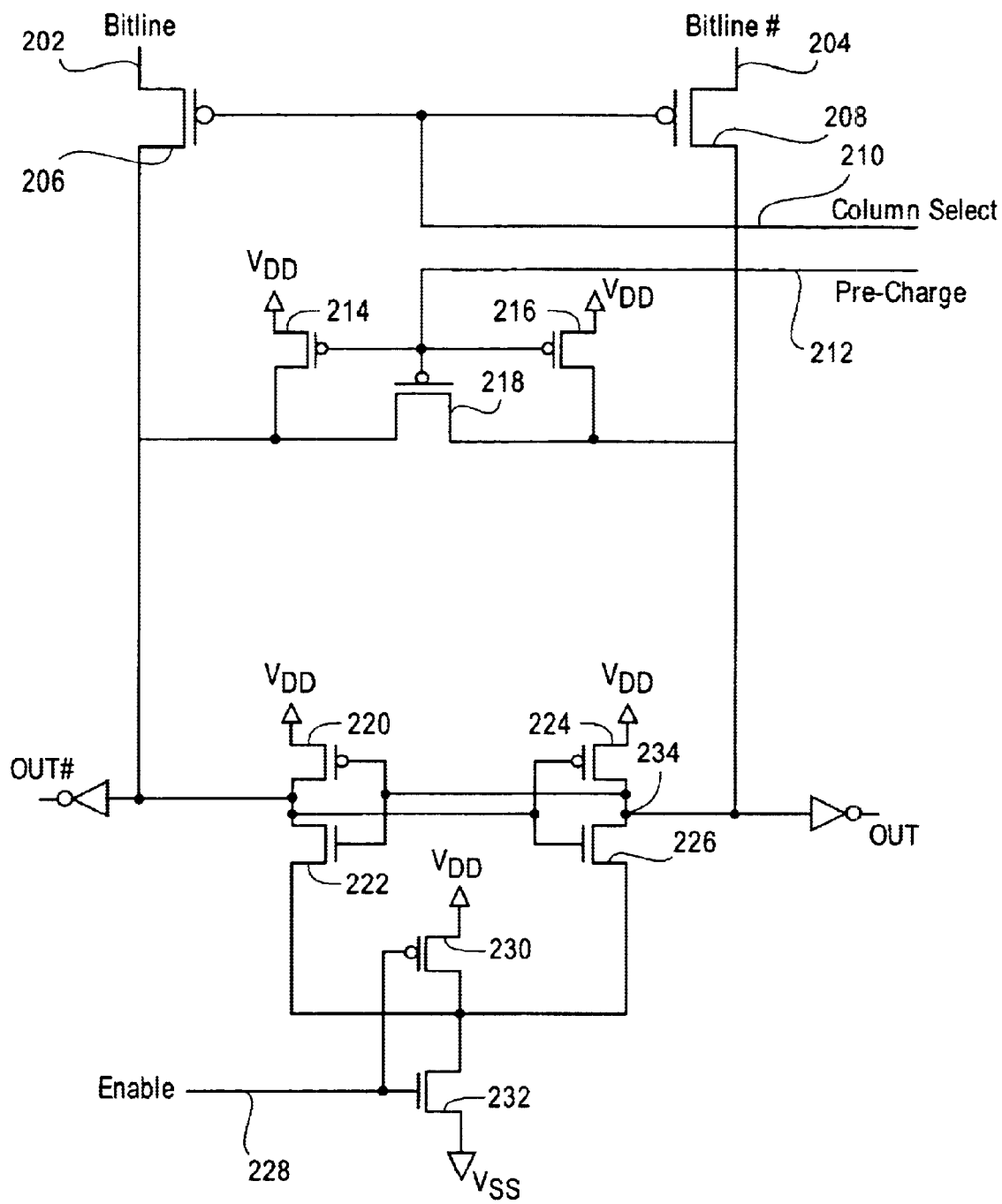
FIG. 2 is a prior art sense amplifier for a SRAM.

The charge transfer scheme discussed above causes the differential voltage between nodes 322 and 324 to develop quickly so that the cross-coupled inverters quickly latch. Furthermore, if $C_3$ is small enough, $V_{DD}C_T/C_L$ may be small enough so that the trip voltage for the inverter comprising pMOSFET 312 and nMOSFET 314 is never reached, which may further increase the speed of the latch and improve its reliability to latch to the correct value. Simulations have shown that the cross-coupled inverters in FIG. 3 latch quicker than the cross-coupled inverters of the prior art latch in FIG. 2. This increased latching speed contributes to less power consumption. Furthermore, note that unlike the prior art scheme of FIG. 2, when enable line 320 is driven LOW so that nMOSFET 314 is OFF but pMOSFETs 312 and 350 are ON, there is no current path from the $V_{DD}$ potential to the $V_{SS}$ potential, which also helps contribute to less power consumption.

As discussed above, as the voltage potential at the source of gate-biased pMOSFET 310 approaches $V_B+|V_T|$, gate-biased pMOSFET 310 will go into its sub-threshold region. As a result, the charge stored on bitline 342 will discharge to $V_{SS}$ supply rail 304 through the selected memory cell. The nMOSFET (not shown) in the selected memory cell is relatively weak, and this discharge occurs relatively slowly. Because read operations occur relatively fast, when the next read operation is performed on this memory cell, bitline 342 may not have fully discharged. As a result, voltage swings on the bitlines may be substantially less than $V_{DD}-V_{SS}$. This reduction in bitline voltage swing also contributes to a reduction in power consumption. Simulation results have shown that this contribution to reduction in power consumption is fairly insensitive to variations in the bias voltage $V_B$.

The speed of the charge transfer to node 322 increases with increasing first capacitance. The first capacitance increases as the number of bitlines multiplexed to the sense amplifier via column-select transistors increases. As a result, the speed of the sense amplifier of FIG. 3 is expected to increase as the number of multiplexed bitlines increases. This is in contrast to the prior art sense amplifier of FIG. 2, where its speed decreases as the number of multiplexed bitlines increases.

Various modifications may be made to the disclosed embodiment without departing from the scope of the invention as defined below. For example, latches other than that shown in FIG. 3 may be used. Also, other types of pass transistors may be used in place of pMOSFETs 356 and 358, or nMOSFETs 352 and 354. For example, a nMOSFET may be used in place of pMOSFET 356 or pMOSFET 358, where the gate of the nMOSFET is driven so that the nMOSFET is OFF during the pre-charge phase and switches ON during the enable phase. Likewise, a pMOSFET may be used in place of nMOSFET 352 or nMOSFET 354, where the gate of the pMOSFET is driven so that the pMOSFET is ON during the pre-charge phase and switches OFF during the enable phase. Thus, in the above description, the term "pass transistor" may be used in place of pMOSFET 356, pMOSFET 358, nMOSFET 352, or nMOSFET 354, provided it is understood that any pass transistors substituted for nMOSFETs 352 or 354 are ON during the pre-charge phase and OFF during the enable phase, and any pass transistors substituted for pMOSFETs 356 or 358 are OFF during the pre-charge phase and are ON during the enable phase.

What is claimed is:

1. A sense amplifier having a pre-charge phase, the sense amplifier comprising:
   a latch comprising a first inverter and a second inverter, wherein the first and second inverters are cross-coupled to each other;
   a first gate-biased pMOSFET coupled to the latch and comprising a source, a drain, and a gate;
   a second gate-biased pMOSFET coupled to the latch and comprising a source, a drain, and a gate;
   a first supply rail; and
   at least one pullup pMOSFET to provide a low impedance path between the first supply rail and the sources and drains of the first and second gate-biased pMOSFETs during the pre-charge phase.

2. The sense amplifier as set forth in claims 1, wherein the first supply rail has a voltage $V_{DD}$ and the gates of the first and second gate-biased pMOSFETs are biased to a bias voltage $V_B$, wherein the first and second gate-biased pMOSFETs have threshold voltages $V_{T1}$ and $V_{T2}$, respectively, wherein $V_B \leq V_{DD} - \max\{|V_{T1}|, |V_{T2}|\}$.

3. The sense amplifier as set forth in claim 2, further comprising:
   a second supply rail having a voltage $V_{SS}$, where $V_{SS} < V_B$;
   wherein the first inverter comprises an output port and the second inverter comprises an output port; wherein during the pre-charge phase a low impedance path is provided between the second supply rail and the output ports of the first and second inverters.

4. A SRAM having a pre-charge phase and an enable phase; the SRAM comprising:
   a first supply rail having a first voltage;
   a second supply rail having a second voltage; and
   a sense amplifier, the sense amplifier comprising:
      a first inverter comprising a first pMOSFET comprising a gate, a source, and a drain; and a first nMOSFET comprising a gate connected to the gate of the first pMOSFET, a drain connected to the drain of the first pMOSFET, and a source; and
      a second inverter comprising a second pMOSFET comprising a gate connected to the drain of the first pMOSFET, a source, and a drain connected to the gate of the first pMOSFET; and a second nMOSFET comprising a gate connected to the gate of the second pMOSFET, a drain connected to the drain of the second pMOSFET, and a source;
      a first gate-biased pMOSFET comprising a gate, a source, and a drain; wherein during the pre-charge phase the first gate-biased pMOSFET has its source and drain at the first voltage;
      a second gate-biased pMOSFET comprising a gate, a source, and a drain; wherein during the pre-charge phase the second gate-biased pMOSFET has its source and drain at the first voltage;
      a bias circuit to provide a bias voltage to the gates of the first and second gate-biased pMOSFETs;
      a first pass transistor to provide during the enable phase a low impedance path between the drain of the first gate-biased pMOSFET and the drain of the first pMOSFET; and
      a second pass transistor to provide during the enable phase a low impedance path between the drain of the second gate-biased pMOSFET and the drain of the second pMOSFET.

5. The SRAM as set forth in claim 4, wherein during the pre-charge phase the sources, drains, and gates of the first and second nMOSFETs are at the first voltage; and during the enable phase the sources of the first and second pMOSFETs are at the second voltage.

6. The SRAM as set forth in claim 4, wherein the first and second gate-biased pMOSFETs have, respectively, first and second threshold voltages; wherein during operation of the SRAM the bias voltage is greater than the second voltage, and the bias voltage is not greater than the difference of the second voltage and the maximum of the absolute values of the first and second threshold voltages.

7. A SRAM comprising:
   a sense amplifier comprising first and second gate-biased pMOSFETs, each comprising a gate, a drain, and a source;
   a memory cell to store a bit of information;
   first and second bitlines connected to the memory cell;
   first and second column-select transistor to couple the first and second bitlines to, respectively, the sources of the first and second gate-biased pMOSFETs; and
   a bias circuit to bias the gates of the first and second gate-biased pMOSFETs to a bias voltage $V_B$.

8. The SRAM as set forth in claim 7, the SRAM having a pre-charge phase, wherein the first and second gate-biased pMOSFETs have, respectively, threshold voltages $V_{T1}$, and $V_{T2}$, the sense amplifier further comprising:
   first and second inverters cross-coupled to each other to form a latch, the first and second inverters each having an output port;
   wherein during the pre-charge phase the first and second bitlines and the sources and drains of the gate-biased pMOSFETs are charged to $V_{DD}$, and the output ports of the first and second inverters are charged to $V_{SS}$, where $V_{SS} < V_B \leq V_{DD} - \max\{|V_{T1}|, |V_{T2}|\}$.

9. The SRAM as set forth in claim 8, the sense amplifier having an enable phase to read the stored bit of information, wherein during the enable phase:
   a low impedance path is provided between the drain of the first gate-biased pMOSFET and the output port of the first inverter; and
   a low impedance path is provided between the drain of the second gate-biased pMOSFET and the output port of the second inverter.

10. A computer system comprising:
    a microprocessor on a die;
    an off-die cache in communication with the microprocessor;

the microprocessor further comprising a cache; the cache comprising:
  a sense amplifier comprising first and second gate-biased pMOSFETs, each comprising a gate, a drain, and a source;
  a memory cell to store a bit of information;
  first and second bitlines connected to the memory cell;
  first and second column-select transistors to couple the first and second bitlines to, respectively, the sources of the first and second gate-biased pMOSFETs; and
  a bias circuit to bias the gates of the first and second gate-biased pMOSFETs to a bias voltage $V_B$.

11. The computer system as set forth in claim 10, the cache having a pre-charge phase, wherein the first and second gate biased pMOSFETs have, respectively, threshold voltages $V_{T1}$ and $V_{T2}$, the sense amplifier further comprising:
  first and second inverters cross-coupled to each other to form a latch, the first and second inverters each having an output port;
  wherein during the pre-charge phase the first and second bitlines and the sources and drains of the gate-biased pMOSFETs are charged to $V_{DD}$, and the output ports of the first and second inverters are charged to $V_{SS}$, where $V_{SS} < V_B \leq V_{DD} - \max\{|V_{T1}|, |V_{T2}|\}$.

12. The computer system as set forth in claim 11, the sense amplifier having an enable phase to read the stored bit of information, wherein during the enable phase:
  a low impedance path is provided between the drain of the first gate-biased pMOSFET and the output port of the first inverter; and
  a low impedance path is provided between the drain of the second gate-biased pMOSFET and the output port of the second inverter.

13. A sense amplifier comprising:
  a latch comprising a fat inverter and a second inverter, wherein the first and second inverters are cross-coupled to each other;
  a first gate-biased pMOSFET;
  a second gate-biased pMOSFET;
  a first pass element to provide a low impedance path from the first gate-biased pMOSFET to the latch; and
  a second pass element to provide a low impedance path from the second gate-biased pMOSFET to the latch.

14. The sense amplifier as set forth in claim 13, wherein
the first pass element comprises a first pMOSFET; and
the second pass element comprises a second pMOSFET.

15. A memory comprising:
  a first bitline;
  a second bitline;
  a latch comprising a fist inverter and a second inverter, wherein the first and second inverters are cross-coupled to each other;
  a first gate-biased pMOSFET to transfer a first charge from the first bitline to the latch during a read operation; and
  a second gate-biased pMOSFET to transfer a second charge from the second bitline to the latch during the read operation.

16. The memory as set forth in claim 15, further comprising a memory element to store a bit of information, wherein the first charge is greater than or less than the second charge depending upon the bit of information.

* * * * *

UNITED STATES PATENT AND TRADEMARK OFFICE
CERTIFICATE OF CORRECTION

PATENT NO. : 6,751,141 B1
DATED : June 15, 2004
INVENTOR(S) : Alvandpour et al.

It is certified that error appears in the above-identified patent and that said Letters Patent is hereby corrected as shown below:

Column 1,
Line 54, delete "an" and insert -- and --.

Column 6,
Line 44, delete "$V_{T1}$," and insert -- $V_{T1}$ --.

Column 8,
Line 2, delete "fat" and insert -- first --.
Line 20, delete "fist" and insert -- first --.

Signed and Sealed this

Sixteenth Day of November, 2004

JON W. DUDAS
*Director of the United States Patent and Trademark Office*